(12) United States Patent
Botrie

(10) Patent No.: US 6,646,199 B2
(45) Date of Patent: Nov. 11, 2003

(54) POLYMERIC FOAM GASKETS AND SEALS

(75) Inventor: Alexander Botrie, Toronto (CA)

(73) Assignee: Chemque, Inc. (CA)

( * ) Notice: Subject to any disclaimer, the term of this patent is extended or adjusted under 35 U.S.C. 154(b) by 118 days.

(21) Appl. No.: 09/842,261

(22) Filed: Apr. 26, 2001

(65) Prior Publication Data

US 2002/0010223 A1 Jan. 24, 2002

Related U.S. Application Data

(63) Continuation-in-part of application No. 09/421,559, filed on Oct. 20, 1999.

(51) Int. Cl.[7] .................................................. H05K 9/00
(52) U.S. Cl. ............................ 174/35 GC; 174/35 MS; 277/920
(58) Field of Search .......................... 174/35 R, 35 MS, 174/35 GC; 361/818, 816; 521/76, 99; 252/512, 514; 277/920

(56) References Cited

U.S. PATENT DOCUMENTS

| | | |
|---|---|---|
| 3,194,860 A | 7/1965 | Ehrreich et al. |
| 3,609,104 A | 9/1971 | Ehrreich et al. |
| 4,011,360 A | 3/1977 | Walsh |
| 4,378,322 A | 3/1983 | Atterbury et al. |
| 4,434,541 A | 3/1984 | Powers, Jr. |
| 4,507,359 A | 3/1985 | Powers, Jr. |
| 4,652,695 A | 3/1987 | Busby |
| 4,678,716 A | 7/1987 | Tzeng |
| 4,769,280 A | 9/1988 | Powers, Jr. |
| 4,857,668 A | 8/1989 | Buonanno |
| 4,931,479 A | 6/1990 | Morgan |
| 4,968,854 A | 11/1990 | Benn, Sr. et al. |
| 5,061,566 A | 10/1991 | Morgan |
| 5,141,770 A | 8/1992 | Benn, Sr. et al. |
| 5,284,888 A | 2/1994 | Morgan |
| 5,545,474 A | 8/1996 | Podlaseck et al. |

FOREIGN PATENT DOCUMENTS

| | | |
|---|---|---|
| DE | 9209035.4 | 10/1992 |
| DE | 195 29 624 A1 | 2/1997 |
| EP | 1 094 257 A2 | 4/2001 |
| GB | 2 102 207 A | 1/1983 |

OTHER PUBLICATIONS

J. H. Saunders et al., Polyurethanes—Chemistry and Technology; Part I—Chemistry, Robert E Krieger Publishing Co., Inc. NY, 1978, pp. vii–368.

J. H. Saunders et al., Polyurethanes—Chemistry and Technology, Part II—Technology, John Wiley & Sons, Inc. 1964, pp. v–881.

Polyurethanes, Chemistry & Technology, Part III, Reactions of Isocyanates and their Derivatives, pp. 73–76.

E.N. Doyle, The Development and Use of Polyurethane Products; McGraw–Hill Book Co., pp. Formulas 1–4.

*Primary Examiner*—Hung V. Ngo
(74) *Attorney, Agent, or Firm*—Banner & Witcoff, Ltd.

(57) ABSTRACT

An electrically conductive flexible polyurethane foam including a polyurethane and at least one conductive filler dispersed therein in an amount effective to provide EMI/RFI shielding, wherein the polyurethane comprises an isocyanate component to active hydrogen component in a ratio of at most about 0.20:1. Preferably, the foam has compression deflection value at 50% compression of at most about 25 psi, a foam density of at most 0.95 $g/cm^3$ and/or noise shielding effectiveness at a frequency of about 20 to about 1000 MHz of at least about 10 dB.

45 Claims, No Drawings

POLYMERIC FOAM GASKETS AND SEALS

This application is a continuation-in-part of U.S. application Ser. No. 09/421,559, filed Oct. 20, 1999.

FIELD OF THE INVENTION

This invention relates to electrically conductive, flexible, low-density polyurethane foams useful for conductive gaskets and seals.

BACKGROUND OF THE INVENTION

There is a need for gaskets, seals, and other products that can seal enclosure cabinets and other electrical and electronic housings to prevent the transmission of electromagnetic & radio frequency noise into and out of the enclosed areas they are sealing. They must also provide protection against moisture and particulates such as dust. Such gaskets are placed in covers and between frames, panels, and doors of electronic equipment, cabinets, and housings. These gaskets must be soft with low compression deflection values. Lower compression deflection values generate lower closing forces. This will allow the enclosures and housings to be made from thinner, less rigid materials. They must be capable of being compressed at least 50% for long periods of time without taking a compression set. They must also maintain their conductive and compression recovery properties after many compression-relaxation cycles.

A number of products have been developed to address the need for conductive gaskets. One method uses a two-layer approach. The outer layer contains a conductive metal. The inner core or layer is intended to provide the desirable properties that an effective gasket should have. Such a product is described in co-pending U.S. patent application Ser. No. 09/421,559, which is hereby incorporated by reference in its entirety.

Another product is a high frequency EMI/RFI shielding gasket made by wrapping a strip of knit mesh material or wire mesh around the exterior of a resilient core. Such a mesh-covered core is described in U.S. Pat. No. 4,652,695. The core can be made from any highly compressible material but is usually a flexible, non-conductive polyurethane or polyethylene foam. In U.S. Pat. No. 4,857,668, a fabric-like sheath wrap is used. This wrap is tough and imparts good cut and abrasion resistance. The method of applying the wrap to the core is very efficient and less expensive than other available technology. Good shielding values are obtained; however, the wrap is stiff, causing high compression deflection values. The stiff wrap also makes it very difficult to bend the gasket and thus the gasket is usually applied in straight sections whereby pieces are butted up against each other to form a continuous gasket. It is also very difficult to make a waterproof seal since leaks may form wherever the gasket sections are joined. If a waterproof seal is required, a second, conventional gasket must be used. Moreover, even though the polyurethane foam may have good compression recovery, the wrap has poor memory. This results in a gasket with poor compression recovery. Furthermore, the wrap usually contains large quantities of nickel or silver. This makes the wrap very expensive. In addition, these gaskets cannot be formed-in-place but must be prefabricated. Installation of these gaskets is very labor intensive causing the installation costs and therefore the final gasket costs to be high.

Another method of manufacturing conductive gaskets is to encapsulate conductive fillers inside a plastic matrix. Flexible elastomers, such as silicone and neoprene, are commonly used. U.S. Pat. No. 4,011,360 is an example of many such patents in this area. Flexible elastomers are particularly desirable for gasket materials because of their good performance characteristics and ease of manufacture. Such elastomers have low water absorption and good resistance to cutting. However, due to their high concentrations of conductive metals, the cost of these gaskets is high, particularly when a conductive metal such as silver is used. Most conductive fillers are hard and because these fillers must be used in high concentrations, the elastomers tend to become hard, stiff, and brittle compared to elastomers that do not contain conductive fillers. Currently available conductive elastomeric gaskets are much harder than non-conductive gaskets and it is very difficult, if not impossible, to make them flexible. These gaskets also have very high compression deflection values and poor compression recovery.

Attempts to produce conductive foams have had limited success. U.S. Pat. No. 4,378,322 describes impregnating a prefabricated foam with conductive materials. U.S. Pat. No. 4,931,479 describes producing a high density, high hardness, conductive polyurethane foam for gap filling applications. However, neither of these approaches is suitable for (foam-in-place) gasketing applications.

There is a need for foam in place gaskets without the disadvantages associated with the prior art.

SUMMARY OF THE INVENTION

The invention is directed to electrically conductive flexible polyurethane foams that are suitable for use as gaskets and seals. The gaskets and seals can be used between two conductive surfaces to provide EMI/RFI shielding. The gaskets and seals can be foamed-in-place, prefabricated, or molded, at both room temperature and elevated temperatures. The foams are soft, flexible, and have low compression deflection. Moreover, the foams have good compression recovery, are cut resistant, and have low water absorption.

The invention is directed to an electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.20:1, and the foam has compression deflection value at 50% compression of at most about 25 psi.

The invention is further directed to an electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.20:1, and the foam density is at most about 0.95 g/cm³.

The invention is further directed to an electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.20:1, and wherein the foam has a noise shielding effectiveness of the foam at a frequency of about 20 to about 1000 MHz of at least about 10 dB.

The invention is further directed to a gasket or seal comprising an electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.20:1, wherein the foam has a density of at most about 3 g/cm³, wherein the foam has a noise shielding effectiveness at about 20 to about 1000 MHz of at least about 10 dB and a compression deflection value at 50% compression of less than about 25 psi, and wherein the conductive filler concentration is about 140 phr to about 900 phr.

DETAILED DESCRIPTION OF THE INVENTION

The invention is directed to flexible, conductive polyurethane foam gaskets and seals that are suitable for EMI/RFI shielding. The foams are easy to apply, whether prefabricated or foamed in place, and cured at room temperature and/or at elevated temperatures. The foams are soft, flexible, and have low compression deflection values. They are resilient, have a low compression set, have low water absorption, and have good cut resistance. They also retain their conductivity after many compression-relaxation cycles.

The chemistry of polyurethane foams is well known by those skilled in the art. For years, excellent non-conductive flexible foam gaskets have been made from polyurethane resins. They are primarily thermosetting systems. The foams are mechanically or chemically blown or a combination of both. They are prefabricated or formed-in-place.

Flexible foams offer several advantages over non-foamed elastomers in gasket and seal applications. Foam gaskets are much softer and more flexible than elastomeric gaskets while maintaining excellent physical properties. Softer materials make better gaskets and seals because they form a better seal against the mating surface. Non-conductive elastomers have been produced as soft as around Shore A 20, but elastomers below this hardness have very poor physical properties and are not suitable for most applications. Much softer non-conductive flexible polyurethane foams are possible having hardnesses lower than Shore OO 0. Even at these low hardness values they have many desirable physical properties. Moreover, foams may be produced having much lower compression deflection values and better compression recovery than elastomers. Foam gaskets having excellent water impermeability are also possible.

Foams having very low density may be produced, improving compression recovery and decreasing the hardness and compression deflection substantially. Moreover, a low-density foam gasket has less weight per volume than a non-foamed gasket resulting in lower cost to produce. For example, decreasing the density of the foam by 50% may decrease the gasket cost by 50%. It is preferable to lower the density as much as possible without sacrificing other desirable properties.

Conductive foams can be produced that have the same advantages as non-conductive foams. Moreover, low-density conductive foams can be made at very high loading of conductive fillers. Up to 90% by weight of the total formulation may be conductive fillers. The conductive foams may have foam densities as low as 0.1 g/cm³ and may have hardnesses as low as Shore OO 10, e.g. Shore OO 10 to Shore A 5. Low density, conductive foams do not require a higher percentage of conductive fillers in the composition than high-density conductive foams and elastomers.

An electrically conductive flexible polyurethane foam of the invention is prepared from a composition comprising about 10 wt % to about 70 wt % polyurethane polymer (binder) based on total weight of the composition, preferably about 15 wt % to about 40 wt % polyurethane polymer. The amount of polyurethane used depends on the desired final properties of the composition. Those skilled in the art of polyurethane foam formulation know how to combine the ingredients to maximize properties such as compression set, compression deflection, density, tensile strength, elongation, cut resistance and water resistance to obtain the desired properties.

The mixing ratio of isocyanate component to active hydrogen component is at most about 0.2:1, preferably at most about 0.15:1, more preferably at most about 0.1:1.

The combined viscosity of the isocyanate, the hydrogen donor, and any other liquids present should be less than 100,000 cps, preferably less than 50,000 cps. Lower viscosity polymers produce lower density foams thus the liquid components preferably have low viscosity.

Low density foams are difficult to produce with high viscosity polymers. Heat can be applied to reduce viscosity and to decrease foam density. Viscosity reduction additives can also be used to decrease viscosity.

In conductive, low density, two-component polyurethane foams, it is preferable to use monomeric or polymeric di-isocyanates instead of using an isocyanate-terminated polyol. Isocyanate-terminated polyols have higher viscosities than monomeric or polymeric isocyanates they are made from.

The composition further comprises at least one conductive filler in an amount of about 30 wt % to about 90 wt %, preferably about 40 wt % to about 80 wt %, based on the total weight of the total weight of the composition. At least one conductive filler is dispersed throughout the polymer in an amount effective to achieve EMI/RFI shielding.

The conductive filler has a concentration of about 140 to about 900 parts per 100 parts of resin (polyol and isocyanate combined) ("phr"), preferably about 140 to about 700 phr, more preferably about 140 phr to about 400 phr.

Conductive fillers may be selected from noble metals, base metals, noble metal coated non-noble metals, noble metal coated glass, noble metal coated plastics, noble metal coated ceramics & carbon blacks. Suitable conductive fillers include, but are not limited to, silver, nickel, aluminum, copper, steel & coatings of these on metallic & non-metallic substrates.

The conductive filler may be of any suitable form or shape such as particles, spheres, powders, flakes, etc. If conductive particles are used, the size of the particles is typically between about 1 micron and about 80 microns, preferably between about 10 microns and about 30 microns, most preferably about 20 microns.

It is preferable to use conductive fillers other than particles. Conductive foams tend to lose their conductivity on repeated flexing or compression-relaxation cycles. Thus, in accordance with a preferred embodiment, conductive fillers with high aspect ratios are used which allow flexing of the foam without loss of conductivity. Examples of such high aspect ratio fillers are flakes, fibers, filaments, needles, slivers and flexible, hollow microspheres. High aspect ratio fillers provide better particle-to-particle contact at lower load levels. This provides better conductivity at lower loading levels than is required when using fillers with low aspect ratios. The use of high aspect ratio fillers permits a higher resin (binder) concentration. Therefore, higher physical properties such as tensile strength, elongation, and compression recovery are obtainable with these fillers.

The diameter of high aspect ratio fillers should be between about 0.1 micron and about 100 microns, preferably between about 15 and about 30 microns. The aspect ratio (L/D) is preferably between about 10/1 and about 3000/1, more preferably between about 20/1 and about 100/1.

Flexible, hollow microspheres also show good retention of conductive properties after compression-relaxation cycles. Spherical fillers with some compressibility give superior properties to those that are rigid. Spherical fillers produce gaskets & seals with lower physical properties than other high aspect ratio fillers.

Lower density conductive fillers produce lower density foams. Higher density fillers, on the other hand, prevent the foam from rising, increasing the density of the foam. Even though the reaction of the isocyanate with the hydrogen donor is exothermic, gaskets are usually small and less than about ¾" in diameter and about ½" high, and the reaction does not generate much heat. Therefore low-density fillers make it easier for the foam to rise higher, making the density of the foam lower. The introduction of external heat can also be used to decrease the foam density.

Softer fillers are preferable over harder fillers. Softer fillers produce softer foams with lower compression deflection values. Softer fillers cause less stress on the polyurethane matrix bonding it into the foam. Softer fillers help the foam withstand repeated compression-relaxation cycles that the gasket will be exposed to. Besides cost, it is advantageous to use softer, nonconductive fillers and coat them with a thin layer of a metallic, conductive, filler. The resulting foams have better adhesion to the substrate and better flexibility. Moreover, fillers that are soft and non-abrasive do not abrade the contact parts of the dispensing equipment as much as harder fillers.

Preferably the fillers are soft and have a Mohs hardness of about 5 or less. Mohs is a standard test used to determine the hardness of solid particles. On this scale, diamonds (being the hardest particle) have a hardness of 15. Talc is the softest and is given a hardness of 1. All other particles are in between 1 and 15.

The conductive foams of the invention have densities of at most about 3 g/cm$^3$, preferably at most about 1.5 g/cm$^3$, more preferably at most about 0.95 g/cm$^3$, most preferably about 0.1 to about 0.95 g/cm$^3$. Such foams provide an expansion rate of about 3 to about 30 times the volume of the initial components.

The low density, conductive polyurethane foams of the invention produce gaskets that provide at least adequate electromagnetic shielding. The foams are conductive, have a volume resistivity of about 0.0017 ohm.cm to about 9.5 ohm.cm. and a surface resistivity of about 0.07 ohm/cm$^2$ to about 6.5 ohm/cm$^2$. Once the gasket is applied on the housing or enclosure, there is a resulting reduction in noise level, i.e. a noise shielding effectiveness, of at least about 10 db, preferably at least about 30 db, more preferably at least about 50 db, in the frequency range of about 20 to about 1000 MHz, may be achieved.

The low density, conductive polyurethane foams of the invention produce gaskets that have compression deflection values, measured according to ASTM D3574C, of at most about 25 psi when measured at 50% compression, generally from about 1 psi to about 25 psi, preferably at most about 15 psi, more preferably at most about 5 psi. At 50% compression, compression set, measured as per ASTM D 1056, range from about 0% to about 30%, preferably from about 0% to about 10%.

Hardness, measured according to ASTM D2240, is preferably, in the range of from about Shore OO 0 to about Shore A 30.

In a foam application, the Shore A hardness measures the hardness of the thin skin on top of the foam. Compression deflection measures the force needed to compress the entire foam specimen a certain percentage of its thickness. That is, compression deflection measures the strength of the polyurethane elastomer that makes up the walls of the foam and how much force is required to collapse the cell walls. Compression deflection and Shore A hardness are not dependent on each other. For example, two foams with the same Shore A hardness can have very different compression deflection values.

Gaskets and seals should prevent water from getting into the enclosure where the electronic equipment is contained. Thus low water absorption or high water resistance is important. Water resistance can be measured by, for example, weighing a gasket, submersing the gasket under water for a period of time at a specific temperature, removing the gasket and reweighing. The water absorption is then measured as a percent weight of the gasket. If the initial gasket weight was 100 grams and the water absorbed by the gasket was 1 gram, then the water absorption would be 1%.

The mating surface to the gasket in an electrical enclosure is usually a thin strip of metal or plastic. Thus, gaskets and seals should have high cut resistance. Cut resistance can be measured by, for example, compressing the center of the gasket 50% length wise with a strip of metal or plastic. The diameter of the metal strip may only be 10% of the diameter of the gasket. The gasket and strip are then heated. After heating, the strip is removed and the gasket is inspected for cuts. No cuts are permissible.

Conductive polyurethane foams are highly filled systems. They only contain a small amount of polymer to hold the fillers in place and provide the necessary physical and chemical properties. It is important that the foams retain these properties under actual usage conditions.

The foam cannot develop hair-line cracks after repeated compression cycles. If hair-line cracks do develop, the gasket will lose its electrical conductivity and its ability to provide adequate shielding. One means of determining the retention of conductivity is to measure electrical conductivity after repeated "compression set" cycles. Depending on the intended application of the gasket, these tests can be performed at ambient or elevated temperatures. The number of cycles will also vary.

EXAMPLES

Example 1

A conductive polyurethane foam was prepared from the following components (measured in percent by weight):

| | |
|---|---|
| Chem-Cast 901 Polyol | 28.4 |
| Silver Flakes, 20 micron diameter | 55.6 |
| Silver Coated Inorganic Flakes, 40 micron diameter | 11.1 |
| Isocyanate 608 | 4.9 |
| TOTAL | 100.0 |

Chem-Cast 901 Polyol is a polyether polyol with a viscosity of 100 cps. Isocyanate 608 is a polymeric diphenylmethane diisocyanate with a viscosity of 50 cps. The foam contained 200 parts of conductive fillers per 100 parts of polyurethane resin or 66.7% of the total formulation.

All of the conductive materials were dispersed into the polyol component. The resultant viscosity was 40,000 cps.

The polyol and isocyanate components were placed into a meter-mix-dispenser with the dispensing nozzle attached to a robot arm. The foam gasket was dispensed on a flat surface in the shape of a gasket ½" wide and ½" high.

The foam had a density of 0.5 g/cm$^3$. Compression deflection force at 50% compression was 2.9 psi. Hardness was Shore OO 40. Compression set was 20% at 50%" compression. Water absorption was less than 1%. The attenuation of the electromagnetic radiation of differing frequencies was measured. The noise reduction was between 60 dB and 80 dB between frequencies of 1 & 900 MHz. Volume resistivity was 0.03 ohms.cm. Surface resistivity was 0.5 ohms.cm$^2$.

Example 2

A conductive polyurethane foam was prepared from the following components (measured in percent by weight):

| | |
|---|---|
| Chem-Cast 901 Polyol | 18.6 |
| Silver Flakes, 20 micron diameter | 78.5 |
| | (365 phr) |
| Isocyanate 608 | 2.9 |
| TOTAL | 100.0 |

The resulting foam was conductive with a surface resistivity of 0.2 ohms/cm$^2$.

Example 3

A conductive polyurethane foam was prepared from the following components (measured in percent by weight):

| | |
|---|---|
| Chem-Cast 901 Polyol | 18.6 |
| Silver Flakes, 5 micron diameter | 78.5 |
| | (365 phr) |
| Isocyanate 608 | 2.9 |
| TOTAL | 100.0 |

The resulting foam was not conductive.

Example 4

A conductive polyurethane foam was prepared from the following components (measured in percent by weight):

| | |
|---|---|
| Chem-Cast 901 Polyol | 28.4 |
| Silver Flakes, 20 micron diameter | 55.6 |
| Silver Coated Inorganic Flakes, 40 micron diameter | 11.1 |
| Isocyanate 2005 | 4.9 |
| TOTAL | 100.0 |

Isocyanate 2005 is an isocyanate prepolymer with a viscosity of 2000 cps (40 times thicker than Isocyanate 608).

The density of the conductive foam was 1.1 g/cm$^3$. Thus the foam density was more than two times higher with the higher viscosity Isocyanate 2005 than the lower viscosity Isocyanate 608.

Example 5

Four samples were produced having foam densities above and below 1 g/cm$^3$ and hardness above and below Shore A8.

| Sample | Shore Hardness | Foam Density | 50% Compression Deflection |
|---|---|---|---|
| A | 30 A | 0.91 | 15.2 psi |
| B | 20 A | 0.80 | 9.8 psi |
| C | 10 A | 0.72 | 5.5 psi |
| D | 5 A (OO 45) | 0.50 | 2.9 psi |

A, B, C, and D are all conductive polyurethane foams of the same formulation. Hardness and compression deflection decrease as the foam density decreases.

It will be apparent to those skilled in the art that various modifications and variations can be made in the compositions and methods of the present invention without departing from the spirit or scope of the invention. Thus, it is intended that the present invention cover the modifications and variations of this invention provided they come within the scope of the appended claims and their equivalents.

What is claimed is:

1. A gasket or seal comprising an electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.15:1, wherein the foam a density of at most about 3 g/cm$^3$, wherein the foam has a noise shielding effectiveness at about 20 to about 1000 MHz of at least about 10 dB and a compression deflection value at 50% compression of at most about 25 psi, and wherein the conductive filler concentration is about 140 phr to about 900 phr.

2. An electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.15:1, and the foam has a compression deflection value at 50% compression of at most about 25 psi.

3. The foam of claim 1 wherein the polyurethane comprises an isocyanate component to active hydrogen component in a ratio of at most about 0.1:1.

4. The foam of claim 1 wherein the density of the foam is at most about 3 g/cm$^3$.

5. The foam of claim 4 wherein the density of the foam is at most about 1.5 g/cm$^3$.

6. The foam of claim 5 wherein the density of the foam is at most about 0.95 g/cm$^3$.

7. The foam of claim 1 wherein the conductive filler concentration is about 140 phr to about 900 phr.

8. The foam of claim 7 wherein the conductive filler concentration is about 140 phr to about 700 phr.

9. The foam of claim 8 wherein the conductive filler concentration is about 140 phr to about 400 phr.

10. The foam of claim 1 further comprising a noise shielding effectiveness at a frequency of about 20 to about 1000 MHz of at least about 10 dB.

11. The foam of claim 10 wherein the noise shielding effectiveness is at least about 30 dB.

12. The foam of claim 11 wherein the noise shielding effectiveness is at least about 50 dB.

13. The foam of claim 1 wherein the foam has a compression deflection value at 50% compression of at most about 15 psi.

14. The foam of claim 13 wherein the foam has a compression deflection value at 50% compression of at most about 5 psi.

15. The foam of claim 1 wherein the conductive filler comprises flakes, fibers, filaments, needles, slivers, or hollow microspheres.

16. The foam of claim 15 wherein the conductive filler has a diameter between about 0.1 micron and about 100 microns, and an aspect ratio (L/D) between about 10/1 and about 3000/1.

17. A gasket or seal comprising an electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.15:1, wherein the foam has a density of at most about 1.5 $g/cm^3$, wherein the foam has a shielding effectiveness at about 20 to about 1000 MHz of at least about 30 dB and a compression deflection value at 50% compression of at most about 15 psi, and wherein the conductive filler concentration is about 140 phr to about 700 phr.

18. An electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.15:1, and the foam density is at most about 0.95 $g/cm^3$.

19. The foam of claim 18 wherein the polyurethane comprises an isocyanate component to active hydrogen component in a ratio of at most about 0.10:1.

20. The foam of claim 18 wherein the conductive filler concentration is about 140 phr to about 900 phr.

21. The foam of claim 20 wherein the conductive filler concentration is about 140 phr to about 700 phr.

22. The foam of claim 21 wherein the conductive filler concentration is about 140 phr to about 400 phr.

23. The foam of claim 18 further comprising a noise shielding effectiveness at a frequency of about 20 to about 1000 MHz of at least about 10 dB.

24. The foam of claim 23 wherein the noise shielding effectiveness is at least about 30 dB.

25. The foam of claim 24 wherein the noise shielding effectiveness is at least about 50 dB.

26. The foam of claim 18 wherein the foam has a compression deflection value at 50% compression of at most about 25 psi.

27. The foam of claim 26 wherein the foam has a compression deflection value at 50% compression of at most about 15 psi.

28. The foam of claim 27 wherein the foam has a compression deflection value at 50% compression of at most about 5 psi.

29. The foam of claim 17 wherein the conductive filler comprises flakes, fibers, filaments, needles, slivers, or hollow microspheres.

30. The foam of claim 29 wherein the conductive filler has a diameter between about 0.1 micron and about 100 microns, and an aspect ratio (L/D) between about 10/1 and about 3000/1.

31. An electrically conductive flexible polyurethane foam comprising a polyurethane and at least one conductive filler dispersed therein in an amount effective to provide EMI/RFI shielding, wherein the polyurethane comprises an isocyanate component to active hydrogen component in a ratio of at most about 0.15:1, and wherein the foam has a noise shielding effectiveness of the foam at a frequency of about 20 to about 1000 MHz of at least about 10 dB.

32. The foam of claim 31 wherein the polyurethane comprises an isocyanate component to active hydrogen component in a ratio of at most about 0.10:1.

33. The foam of claim 31 wherein the density of the foam is at most about 3 $g/cm^3$.

34. The foam of claim 33 wherein the density of the foam is at most about 1.5 $g/cm^3$.

35. The foam of claim 34 wherein the density of the foam is at most about 0.95 $g/cm^3$.

36. The foam of claim 31 wherein the conductive filler concentration is about 140 phr to about 900 phr.

37. The foam of claim 36 wherein the conductive filler concentration is about 140 phr to about 700 phr.

38. The foam of claim 37 wherein the conductive filler concentration is about 140 phr to about 400 phr.

39. The foam of claim 31 wherein the noise shielding effectiveness is at least about 30 dB.

40. The foam of claim 39 wherein the noise shielding effectiveness is at least about 50 dB.

41. The foam of claim 31 wherein the foam has a compression deflection value at 50% compression of at most about 25 psi.

42. The foam of claim 41 wherein the foam has a compression deflection value at 50% compression of at most about 15 psi.

43. The foam of claim 42 wherein the foam has a compression deflection value at 50% compression of at most about 5 psi.

44. The foam of claim 31 wherein the conductive filler comprises flakes, fibers, filaments, needles, slivers, or hollow microspheres.

45. The foam of claim 44 wherein the conductive filler has a diameter between about 0.1 micron and about 100 microns, and an aspect ratio (L/D) between about 10/1 and about 3000/1.

* * * * *

UNITED STATES PATENT AND TRADEMARK OFFICE
CERTIFICATE OF CORRECTION

PATENT NO. : 6,646,199 B2
DATED : November 11, 2003
INVENTOR(S) : Alexander Botrie It is certified that error appears in the above-identified patent and that said Letters Patent is hereby corrected as shown below:

Column 4,
Line 31, please replace "total weight of the total weight of the composition" with -- total weight of the composition --.

Column 8,
Line 27, please replace "wherein the foam a density" with -- wherein the foam has a density --.

Signed and Sealed this

Twenty-ninth Day of June, 2004

JON W. DUDAS
*Acting Director of the United States Patent and Trademark Office*